US012237407B2

(12) United States Patent
Dutta et al.

(10) Patent No.: US 12,237,407 B2
(45) Date of Patent: Feb. 25, 2025

(54) HETEROJUNCTION BIPOLAR TRANSISTOR WITH AMORPHOUS SEMICONDUCTOR REGIONS

(71) Applicant: GlobalFoundries U.S. Inc., Malta, NY (US)

(72) Inventors: Anupam Dutta, Kolkata (IN); Rajendran Krishnasamy, Essex Junction, VT (US); Vvss Satyasuresh Choppalli, Bangalore (IN); Vibhor Jain, Williston, VT (US); Robert J. Gauthier, Jr., Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 86 days.

(21) Appl. No.: 17/978,633

(22) Filed: Nov. 1, 2022

(65) Prior Publication Data

US 2024/0145585 A1 May 2, 2024

(51) Int. Cl.
*H01L 29/737* (2006.01)
(52) U.S. Cl.
CPC .................. *H01L 29/7375* (2013.01)
(58) Field of Classification Search
CPC ............. H01L 29/7375; H01L 29/0821; H01L 29/66242; H01L 29/737; H01L 29/66431–66462; H01L 29/7782–7786
See application file for complete search history.

(56) References Cited

U.S. PATENT DOCUMENTS

| | | | |
|---|---|---|---|
| 5,541,120 A | 7/1996 | Robinson et al. | |
| 5,723,896 A | 3/1998 | Yee et al. | |
| 6,767,797 B2 | 7/2004 | Krutsick | |
| 6,989,557 B2 | 1/2006 | Chen | |
| 7,038,242 B2 | 5/2006 | Vande Voorde et al. | |
| 7,476,914 B2 | 1/2009 | Dokumaci et al. | |
| 7,846,805 B2 | 12/2010 | Zhang et al. | |
| 7,855,404 B2 | 12/2010 | Heinemann et al. | |
| 7,880,270 B2 | 2/2011 | Heinemann et al. | |
| 7,972,919 B2 | 7/2011 | Gray et al. | |
| 8,035,167 B2 | 10/2011 | Knoll et al. | |
| 8,415,764 B2 | 4/2013 | Chung et al. | |
| 8,710,510 B2 | 4/2014 | Zhang et al. | |
| 9,368,608 B1 | 6/2016 | Camillo-Castillo et al. | |

(Continued)

FOREIGN PATENT DOCUMENTS

| KR | 20040023477 A | 3/2004 |
|---|---|---|
| KR | 20100031094 A | 3/2010 |

OTHER PUBLICATIONS

Notice of Allowance in related U.S. Appl. No. 17/074,891 dated Apr. 17, 2023, 9 pages.

(Continued)

*Primary Examiner* — Mohammad A Rahman
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to heterojunction bipolar transistors (HBTs) with a buried trap rich region and methods of manufacture. The structure includes: a heterojunction bipolar transistor comprising a collector region, a base region and an emitter region; and at least one non-single-crystal semiconductor region in the collector region of the heterojunction bipolar transistor.

19 Claims, 5 Drawing Sheets

(56) References Cited

U.S. PATENT DOCUMENTS

| | | | |
|---|---|---|---|
| 9,640,528 | B2 | 5/2017 | Preisler et al. |
| 9,721,969 | B2 | 8/2017 | Verma et al. |
| 9,722,057 | B2 | 8/2017 | Camillo-Castillo et al. |
| 9,761,700 | B2 | 9/2017 | McPartlin |
| 9,941,170 | B2 | 4/2018 | Chevalier et al. |
| 10,192,779 | B1 | 1/2019 | Shank et al. |
| 10,224,411 | B2 | 3/2019 | Mallikarjunaswamy et al. |
| 10,367,083 | B2 | 7/2019 | Jain et al. |
| 10,468,294 | B2 | 11/2019 | Peidous et al. |
| 2001/0039095 | A1* | 11/2001 | Marty ............... H01L 29/66242 438/320 |
| 2002/0130409 | A1 | 9/2002 | Oue et al. |
| 2007/0170526 | A1* | 7/2007 | Satou ................. H01L 29/4908 257/408 |
| 2019/0027436 | A1 | 1/2019 | Lum |
| 2019/0080957 | A1 | 3/2019 | Peidous et al. |
| 2019/0109055 | A1 | 4/2019 | Preisler et al. |
| 2019/0140072 | A1 | 5/2019 | Chevalier |
| 2020/0266303 | A1 | 8/2020 | Sai |
| 2021/0074551 | A1 | 3/2021 | Cheng et al. |
| 2022/0123107 | A1 | 4/2022 | Jain et al. |

OTHER PUBLICATIONS

Office Action in related U.S. Appl. No. 17/074,891 dated Dec. 20, 2022, 8 pages.

Response to Office Action in related U.S. Appl. No. 17/074,891 dated Mar. 20, 2023, 10 pages.

Office Action in related U.S. Appl. No. 18/324,637 dated Mar. 27, 2024, 11 pages.

M.C. Ho et al., "Base-Collector Capacitance Reduction of AlGaAs/GaAs Heterojunction Bipolar Transistors by Deep Ion Implantation", University of California, Rockwell International Science Center, downloaded on Aug. 2, 2022 from IEEE Xplore, 2 pages.

Jinxin Zhang et al., "Impact of Bias Conditions on Total Ionizing Dose Effects of 60Coγ in SiGe HBT", IEEE Transactions on Nuclear Science, vol. 63, No. 2, Apr. 2016, 8 pages.

Xin Lin et al., "Novel npn Bipolar Transistor with High Gain, High Early Voltage, and High BVceo in an Advanced SmartMOS Technology", downloaded on Jul. 29, 2022 from IEEE Xplore, 4 pages.

Babcock et al. "Advantages of SiGe-pnp over Si-pnp for analog and RF enhanced CBiCMOS and Complementary Bipolar design usage", IEEE, 2016, 10 pages.

Specification and drawings in U.S. Appl. No. 17/074,891, filed Oct. 20, 2020, 27 pages.

Specification and drawings in U.S. Appl. No. 17/075,056, filed Oct. 20, 2020, 37 pages.

Specification and drawings in U.S. Appl. No. 16/553,737, filed Aug. 26, 2019, 18 pages.

Specification and drawings in U.S. Appl. No. 16/598,064, filed Oct. 10, 2019, 23 pages.

Vibhor Jain et al., "DC and RF breakdown voltage characteristics of SiGe HBTs for WiFi PA applications", downloaded on Sep. 9, 2022 from IEEE Xplore, 4 pages.

Foreign Office Action dated Aug. 29, 2024 in KR Application No. 10-2022-0081152 with Google Machine Translation, 14 pages.

* cited by examiner

HETEROJUNCTION BIPOLAR TRANSISTOR WITH AMORPHOUS SEMICONDUCTOR REGIONS

FIELD OF THE INVENTION

The present disclosure relates to semiconductor structures and, more particularly, to heterojunction bipolar transistors (HBTs) with amorphous semiconductor regions and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications due to good RF performance, high breakdown voltage and integration with CMOS devices.

In HBT applications, though, there is a trade-off between breakdown voltage and high RF performance. That is, an increase in the breakdown voltage of a HBT may result in degrading RF device performance. In an attempt to increase breakdown voltage without degrading device performance, designs have included adjusting the dopant profile of the collector/base junction, using different substrate materials which exhibit wider bandgaps, or using an insulator gate bipolar transistor. These schemes, though, result in poor RF performance.

SUMMARY

In an aspect of the disclosure, a structure comprises: a heterojunction bipolar transistor comprising a collector region, a base region and an emitter region; and at least one non-single-crystal semiconductor region in the collector region of the heterojunction bipolar transistor.

In an aspect of the disclosure, a structure comprises: a heterojunction bipolar transistor comprising a collector region, a base region and an emitter region; a shallow trench isolation structure below the base region in a semiconductor substrate of the collector region; and at least one amorphous semiconductor region close to a junction of the base region and the collector region and a corner of the shallow trench isolation structure.

In an aspect of the disclosure, a method comprises: forming a heterojunction bipolar transistor comprising a collector region, a base region and an emitter region; and forming at least one amorphous semiconductor region in the collector region of the heterojunction bipolar transistor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to heterojunction bipolar transistors (HBTs) with amorphous semiconductor regions and methods of manufacture. More specifically, the present disclosure relates to a SiGe heterojunction bipolar transistor (HBT) with a buried amorphous semiconductor region in the collector region. In embodiments, the amorphous semiconductor region comprises a high resistivity semiconductor material adjacent to shallow trench isolation structures and above a sub-collector region. Advantageously, the amorphous semiconductor region increases breakdown voltage of a high voltage (HV) SiGe HBT (e.g., NPN) device, without any significant changes to other performance parameters, e.g., Ccb, Ft, Fmax, Gm etc.

In embodiments, the SiGe HBT is provided on a bulk wafer with the buried amorphous semiconductor region partially surrounding shallow trench isolation structures above a sub-collector region. In embodiments, the amorphous semiconductor region may be a buried trap rich semiconductor region comprising amorphous Si material (e.g., trap rich polycrystalline silicon material) located below the shallow trench isolation structures and, in embodiments, extending to and contacting the sub-collector region. In further embodiments, the amorphous semiconductor region may be formed close to a collector base junction and at a corner of the shallow trench isolation structures.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
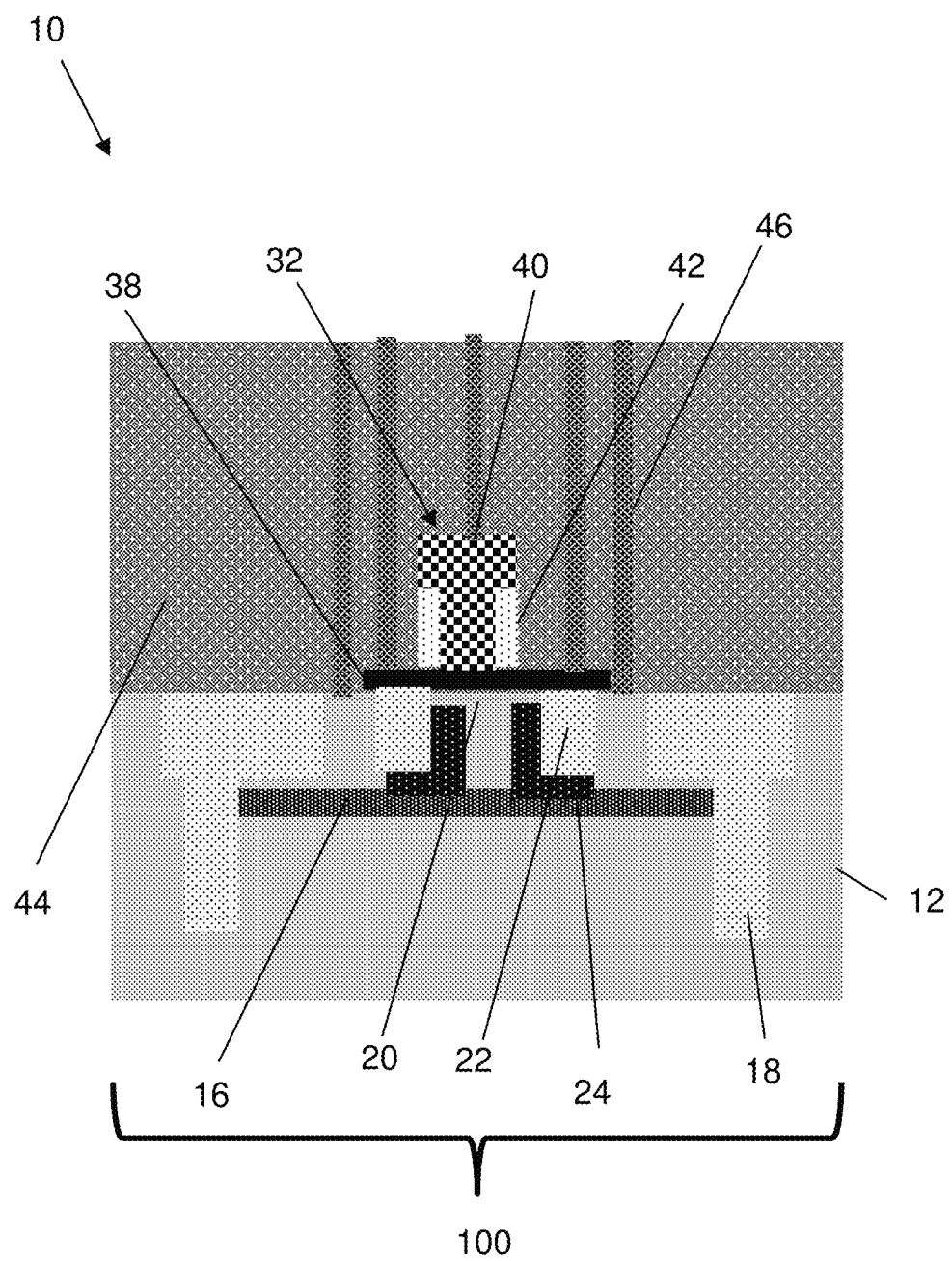
FIG. 1 shows a device with amorphous semiconductor regions, amongst other features, and respective fabrication processes in accordance with aspects of the present disclosure.

FIG. 1 shows a device with amorphous semiconductor regions, amongst other features, and respective fabrication processes in accordance with aspects of the present disclosure. More specifically, the device 10 of FIG. 1 includes a semiconductor substrate 12 preferably composed of single crystalline Si material with any suitable crystallographic orientation (e.g., a (100), (110), (111), or (001) crystallographic orientation). The semiconductor substrate 12 may be composed of other bulk semiconductor materials, including but not limited to, SiGe, SiGeC, SiC, GaAs, InAs, InP, and other III/V or II/VI compound semiconductors. For purposes of this description, device region 100 is representative of a SiGe HBT.

FIG. 1 further shows a sub-collector region 16 formed in the semiconductor substrate 12 within the HBT region 100. In embodiments, the sub-collector region 16 may be formed by an implantation process, e.g., using an N-type implant for a HBT NPN device as described with respect to FIG. 5A. Depending on the parameters of the implantation process, the sub-collector region 16 could diffuse into the semiconductor substrate 12 about 0.1-1.0 micron deep in a 2 micron thick substrate material 12; although other dimensions are contemplated herein.

The sub-collector region 16 may extend between deep trench isolation structures 18. The deep trench isolation structures 18 may be used to define the collector region 20 in the device region 100, above the sub-collector region 16. More specifically, the deep trench isolation structures 18 may be used to encapsulate an HBT device 32 to provide isolation of the HBT device 32, e.g., isolating or surrounding a collector region 20. In embodiments, the collector region 20 may be an epitaxial semiconductor material, e.g., Si, grown over the sub-collector region 16.

Shallow trench isolation structures 22 may be formed in the collector region 20, over the sub-collector region 16 in the HBT region 100. As shown, the sub-collector region 16 can be vertically below and does not contact the shallow trench isolation structures 22. In alternative embodiments, it is possible to have the shallow trench isolation structures 22 touching the sub-collector region 16. The deep trench isolation structures 18 and shallow trench isolation structures 22 can be formed by conventional lithography, etching and deposition methods known to those of skill in the art as described in more detail with respect to FIG. 5C.

Still referring to FIG. 1, non-single-crystal semiconductor regions 24 may be formed at an impact ionization peak point, e.g., close to a collector base junction. In more specific embodiments, the non-single-crystal semiconductor regions 24 may be trap rich regions and, more specifically, non-single-crystal semiconductor regions 24 formed close to the collector base junction and at a corner of the shallow trench isolation structures 22. In still more specific embodiments, the non-single-crystal semiconductor regions 24 may be formed in the collector region 20, above the sub-collector region 16. In these configurations, the non-single-crystal semiconductor regions 24 may be in direct contact at a corner and, more preferably a sidewall and bottom surface of the shallow trench isolation structures 22, extending to and contacting an upper surface of the sub-collector region 16. As described with respect to FIGS. 2 and 3, the non-single-crystal semiconductor regions 24 may be either below or along an inner sidewall of the shallow trench isolation structures 22. In further embodiments, the non-single-crystal semiconductor regions 24 may or may not contact the sub-collector region 16.

The non-single-crystal semiconductor regions 24 may be an amorphous layer of silicon material. In more specific embodiments, the non-single-crystal semiconductor regions 24 may be a high resistivity amorphous semiconductor material located at least at a corner of the shallow trench isolation structures 22 in the collector region 20. In further specific embodiments, the non-single-crystal semiconductor regions 24 may be trap rich regions comprising damaged silicon material, e.g., a-Si and/or polysilicon material abutting the shallow trench isolation structures 22. The non-single-crystal semiconductor regions 24 can be formed using an implantation mask to define selected areas exposed for the implantation of the non-single-crystal semiconductor regions 24, as described in further detail with respect to FIG. 5E.

In the HBT region 100, the bipolar heterojunction transistor 32 includes a base region 38 and an emitter region 40. The base region 38 can be composed of doped SiGe material as an example. In embodiments, the dopant of the SiGe material can be a p-type dopant, e.g., Boron (B). The emitter region 40 may be doped Si material, as an example. In embodiments, the dopant can be a n-type dopant, e.g., Arsenic (As), Phosphorus (P) and Sb, among other suitable examples.

The base region 38 and the emitter region 40 may be formed, e.g., deposited, by conventional CVD processes, followed by conventional lithography and etching (e.g., patterning) processes. The base region 38 may be provided above the collector region 20 and in contact with the semiconductor substrate 12. Sidewalls 42 may be formed on the emitter region 40, e.g., oxide and/or nitride material, as is known in the art. The non-single-crystal semiconductor regions 24 preferably do contact the base region 38; instead, the non-single-crystal semiconductor regions 24 are close to the collector side of the junction of the collector region 20 and the base region 38.

Following the formation of the device (e.g., HBT 32) in region 100, a silicide process can be provided to form contacts to the appropriate active regions, e.g., base region 38, emitter region 40 and collector region 20. As should be understood by those of skill in the art, the silicide process begins with deposition of a thin transition metal layer, e.g., nickel, cobalt or titanium, over fully formed and patterned devices. After deposition of the material, the structure can be heated allowing the transition metal to react with exposed silicon (or other semiconductor material as described herein) in the active regions of the semiconductor device (e.g., base region 38, emitter region 40 and collector region 20) forming a low-resistance transition metal silicide. Following the reaction, any remaining transition metal can be removed by chemical etching, leaving silicide contacts in the active regions of the device.

An interlevel dielectric material 44 may be formed (e.g., deposited) in the device region 100 with contacts 46 formed to the silicide contacts of the e.g., base region 38, emitter region 40 and collector region 20 (e.g., contacting reach through implants). The interlevel dielectric material 44 may be an oxide and/or nitride material deposited by a CVD process. The contacts 46 can be metal or metal alloy material, preferably composed of tungsten. The contacts 46 can be formed by conventional lithography and etching processes through the interlevel dielectric material 44 to form trenches, followed by deposition of conductive material within the trenches. Any residual material on the interlevel dielectric material 44 can be removed by a CMP process.

Figure 2:
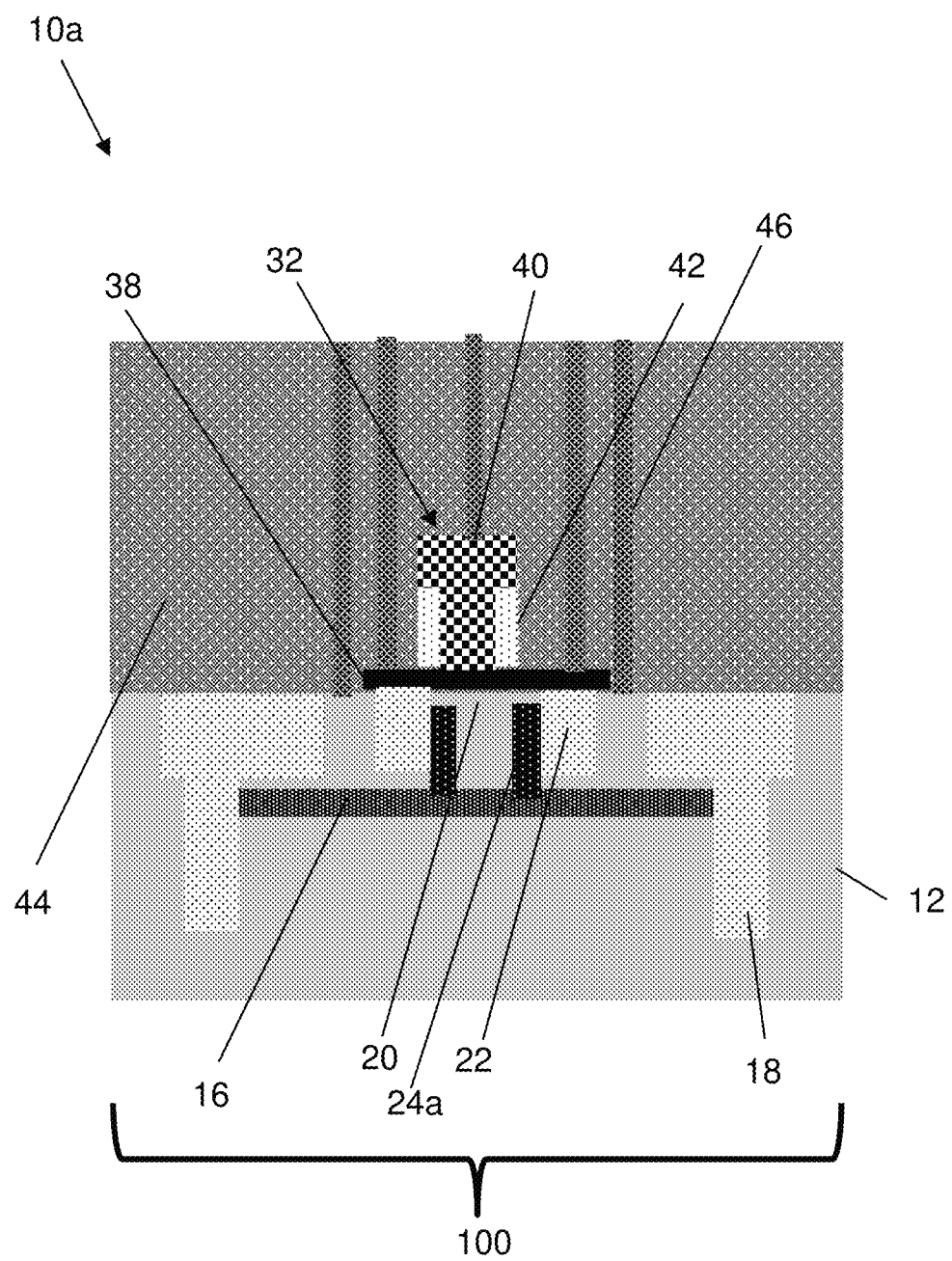
FIG. 2 shows a device with amorphous semiconductor regions, amongst other features, in accordance with additional aspects of the present disclosure.

FIG. 2 shows a structure 10b comprising the device 32 with non-single-crystal semiconductor regions 24a. In FIG. 2, the non-single-crystal semiconductor regions 24a contact an inner sidewall of the shallow trench isolation structures 22, extending to and contacting an upper surface of the sub-collector region 16. The non-single-crystal semiconductor regions 24a may be within the collector region 20 and may or may not contact the sub-collector region 16. The non-single-crystal semiconductor regions 24a may be a high resistivity material such as damaged silicon material, e.g., a-Si and/or polysilicon material touching the inner sidewalls of the shallow trench isolation structures 22 (at a corner thereof). The remaining features of the structure 10b are similar to the structure 10a of FIG. 1.

Figure 3:
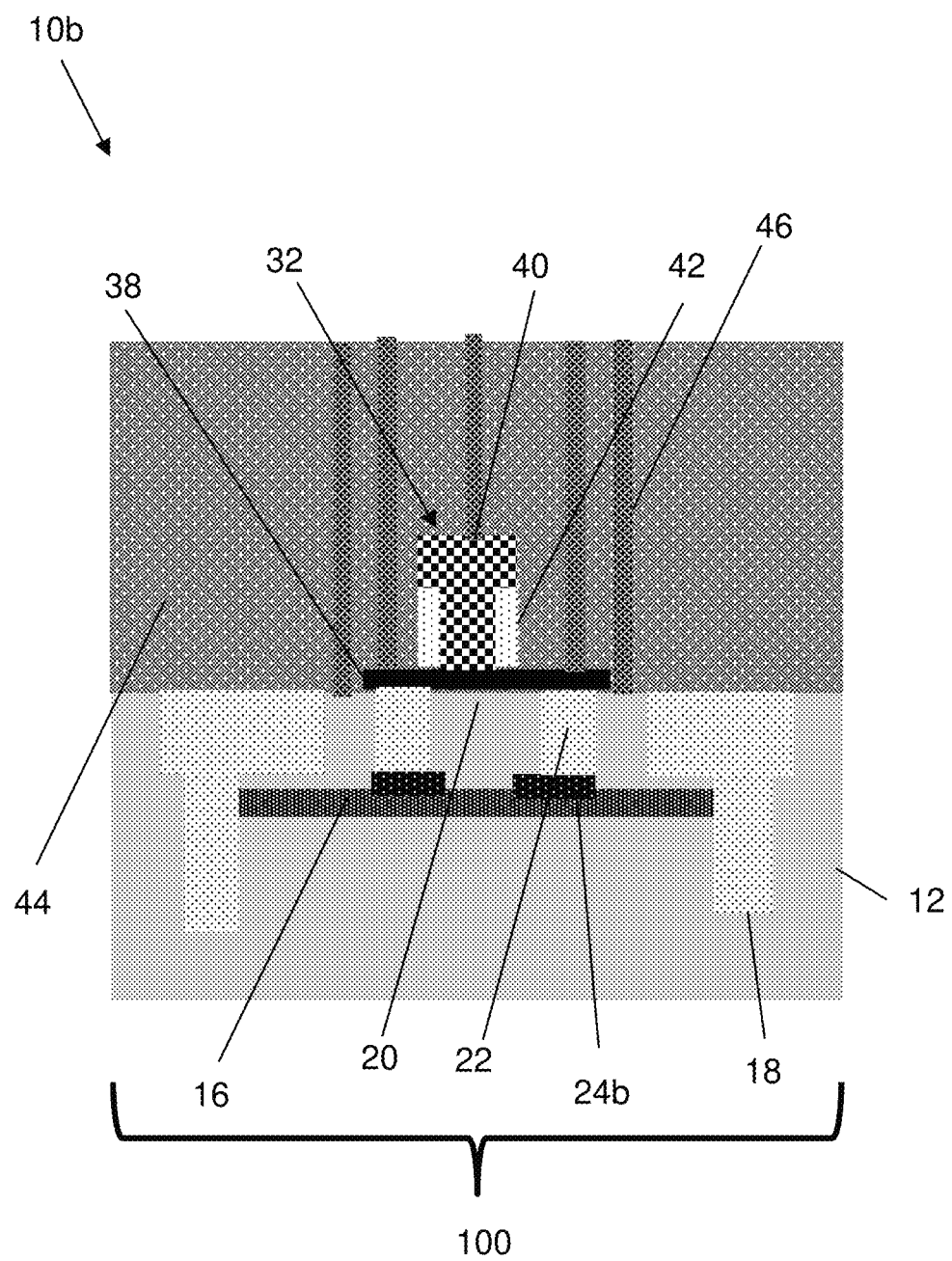
FIG. 3 shows a device with amorphous semiconductor regions, amongst other features, in accordance with additional aspects of the present disclosure.

FIG. 3 shows a structure 10c comprising the device 32 with the non-single-crystal semiconductor regions 24b in contact with a bottom surface of the shallow trench isolation structures 22, extending to and contacting an upper surface of the sub-collector region 16. The non-single-crystal semiconductor regions 2b4 may be within the collector region 20 and may or may not contact the sub-collector region 16. The non-single-crystal semiconductor regions 24b may be a high resistivity material such as damaged silicon material, e.g., trap rich regions, a-Si and/or polysilicon material touching the inner sidewalls of the shallow trench isolation structures 22. The remaining features of the structure 10c are similar to the structures 10a, 10b of FIGS. 1 and 2.

Figure 4:
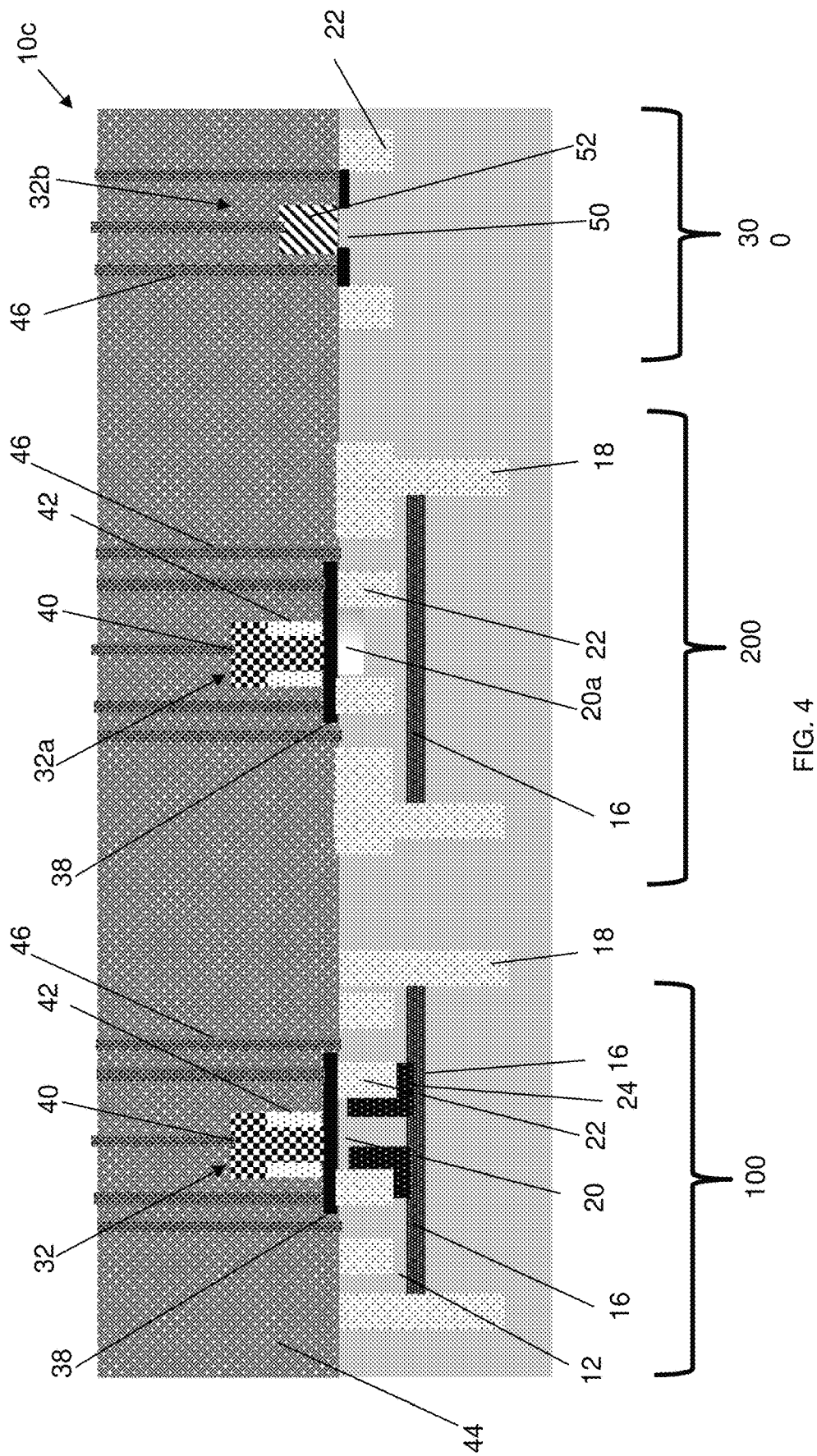
FIG. 4 shows integrated devices on a single wafer and respective fabrication processes in accordance with aspects of the present disclosure.

FIG. 4 shows integrated devices in accordance with aspects of the present disclosure. The integrated device include device regions 100, 200, 300 formed on a same wafer, e.g., semiconductor substrate 12. The device region 100 is representative of an HBT 32 with the non-single-crystal semiconductor regions 24 as described with respect to FIGS. 1-3. The device region 200 may be representative of an HBT 32a without amorphous semiconductor regions, and device region 300 may be representative of a field effect transistor (FET) 32b. The HBTs 32, 32a can be a SiGe power amplifier, as an example. The HBT 32a may include a doped collector region 20a which exhibits high Ft/Fmax. The FET 32b can be a switch or LNA or a logic transistor.

Still referring to FIG. 4, the FET 32b includes source and drain regions 50 and a gate electrode 52, each of which electrically connect to the contacts 46. The gate electrode 52 may be formed on a gate dielectric material also representatively shown as reference numeral 52. The gate electrode 52 may be a workfunction metal as is known in the art, and the gate dielectric material may be a high-k dielectric material as an example. The field effect transistor 32b may also be devoid of the amorphous semiconductor regions.

The FET 32b can be formed using conventional gate formation processes, e.g., gate first processes or replacement gate processes. For example, in the gate first processes, a gate dielectric material and workfunction material(s) are deposited and patterned using conventional CMOS fabrication process as is known in the art. The gate dielectric material can be a high-k gate dielectric material, e.g., HfO$_2$. Examples of the workfunction materials include, e.g., Ti, TiAlC, Al, TiAl, TaN, TaAlC, TiN, TiC, TaC, Co, etc. The workfunction materials may be deposited by chemical vapor deposition (CVD), physical vapor deposition (PVD) including sputtering, atomic layer deposition (ALD) or other suitable method. A sidewall material, e.g. oxide and/or nitride, can be formed on the patterned gate dielectric material and workfunction material(s) using conventional deposition processes followed by an anisotropic etching process. The source and drain regions 50 can be formed by conventional ion implantation processes, as an example. In alternative examples, the source and drain regions 50 can be raised source and drain regions formed by a doped epitaxial process.

FIGS. 5A-5E show fabrication processes for manufacturing the device shown in FIG. 1. Similar processes may be used to manufacture the device of FIGS. 2 and 3.

Figure 5A:
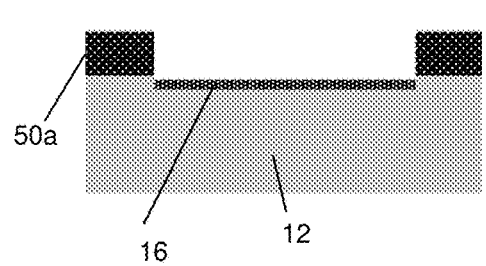
FIGS. 5A-5E show fabrication processes for manufacturing the device shown in FIG. 1.

In FIG. 5A, the sub-collector region 16 may be formed in the semiconductor substrate 12 by an ion implant process, using a patterned mask 50a. In the implantation process, the patterned implantation mask 50a can be used to define selected areas exposed for the implantation of the sub-collector region 16. The patterned implantation mask 50a may include a layer of a light-sensitive material, such as an organic photoresist, applied by a spin coating process, pre-baked, exposed to light projected through a photomask, baked after exposure, and developed with a chemical developer. The patterned implantation mask 50a has a thickness and stopping power sufficient to block masked areas against receiving a dose of the implanted ions. The patterned implantation mask 50 used to select the exposed area can be stripped after implantation. Following the implant process, an anneal can be performed to repair the damage from the implant. The implant can be a n-type dopant, e.g., Arsenic (As), Phosphorus (P) and Sb, among other suitable examples.

Figure 5B:
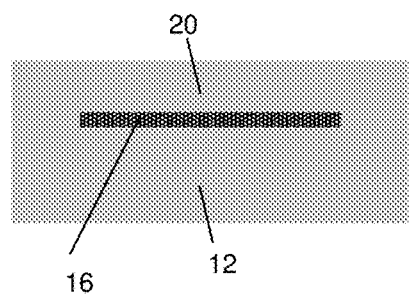

In FIG. 5B, a collector region 20 is formed over the sub-collector region 16. In embodiments, the collector region 20 may be formed by an epitaxial growth process as is known in the art. The collector region 20 may be Si material, as an example.

Figure 5C:
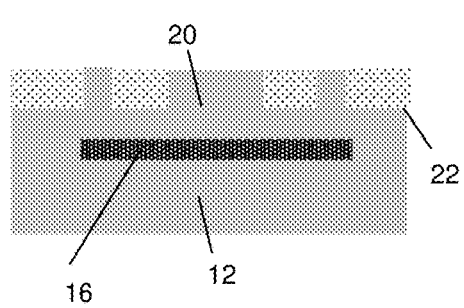

In FIG. 5C, shallow trench isolation structures 22 are formed in the semiconductor substrate 12. The shallow trench isolation structures 22 (and deep trench isolation structures (not shown in this representation)) can be formed by conventional lithography, etching and deposition methods known to those of skill in the art. For example, a resist formed over the semiconductor substrate 12 is exposed to energy (light) to form a pattern (opening). An etching process with a selective chemistry, e.g., reactive ion etching (RIE), can be used to form one or more trenches in the semiconductor substrate 12 through the openings of the resist. Following resist removal by a conventional oxygen ashing process or other known stripants, insulator material, e.g., SiO$_2$, can be deposited by any conventional deposition processes, e.g., chemical vapor deposition (CVD). Any residual insulator material on the surface of the semiconductor substrate 12 can be removed, e.g., planarized, by conventional chemical mechanical polishing (CMP) processes. This process will also planarize the shallow trench isolation structures 22.

Figure 5D:
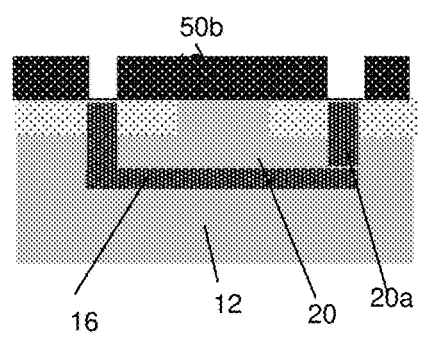

In FIG. 5D, reach through implants 20a may be formed to the sub-collector region 16. The reach through implants 20a may be formed by an ion implantation process, using the patterned implantation mask 50b in a similar manner as already described herein.

Figure 5E:
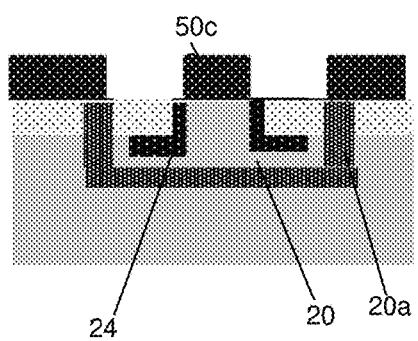

In FIG. 5E, the non-single-crystal semiconductor regions 24 are formed in the collector region 20, above the sub-collector region 16. The non-single-crystal semiconductor regions 24 may be formed by an implantation process, using the patterned implantation mask 50c. The non-single-crystal semiconductor regions 24 can be a high resistivity region, e.g., higher than the resistivity of the semiconductor substrate 12, which significantly reduces substrate leakage. For example, the non-single-crystal semiconductor regions 24 can be a trap rich regions comprising amorphous material, e.g., polycrystalline silicon layer, with a high resistivity. In embodiments, the non-single-crystal semiconductor regions 24 may be formed by a blanket argon implant process; although the use of any non-dopant or noble gas is contemplated herein for the implantation process. As an illustrative, non-limiting example, the semiconductor substrate 12 can be subjected to an argon implant at 400 KeV and a dose of $1.25 \times 10^{15}$ cm$^{-2}$. By way of further illustrative examples, other implant parameters are contemplated herein depending on the desired thickness and depth of the implant region including, e.g., the ion dose may be less than or greater than $1.25 \times 10^{15}$ cm$^{-2}$ or within a range of $1 \times 10^{13}$ cm$^{-2}$ to $5 \times 10^{16}$ cm$^{-2}$. The thickness of the non-single-crystal semiconductor regions 24 can be adjusted depending on the parameters of the implantation process.

Following the implantation process, an anneal process may be performed that recrystallizes the top layer of the non-single-crystal semiconductor regions 24 into a single crystal region. In particular, the thermal process repairs or heals the damage to (i.e., recrystallize or regrow) the semiconductor material of the modified layer. For example, the anneal may be a rapid thermal anneal (RTA) performed with a peak temperature in a range of 860° C. to 1125° C. with a dwell time at the peak temperature of 34 milliseconds to 60 seconds and, in a particular, the peak temperature may be 1000° C. held for a dwell time of 5 seconds. In this way, the non-single-crystal semiconductor regions 24 will not contact the base region 38 as shown in FIGS. 1-4.

The heterojunction bipolar transistor (and other devices disclosed herein) can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a heterojunction bipolar transistor comprising a collector region, a base region and an emitter region; and
   at least one non-single-crystal semiconductor region in the collector region of the heterojunction bipolar transistor,
   wherein the non-single-crystal semiconductor region is vertically above a sub-collector region of the heterojunction bipolar transistor and within the collector region.

2. The structure of claim 1, further comprising a sub-collector region vertically below the collector region, and the at least one non-single-crystal semiconductor region being above the sub-collector region within the collector region.

3. The structure of claim 1, further comprising a shallow trench isolation structure below the base region of the heterojunction bipolar transistor, and the at least one non-single-crystal semiconductor region abutting the shallow trench isolation structure.

4. A structure comprising:
   a heterojunction bipolar transistor comprising a collector region, a base region and an emitter region; and
   at least one non-single-crystal semiconductor region in the collector region of the heterojunction bipolar transistor,
   wherein the at least one non-single-crystal semiconductor region contacts a sidewall and/or a bottom of a shallow trench isolation structure below the base region of the heterojunction bipolar transistor.

5. The structure of claim 4, wherein the at least one non-single-crystal semiconductor region contacts a sub-collector region of the heterojunction bipolar transistor.

6. The structure of claim 3, wherein the at least one non-single-crystal semiconductor region contacts a sidewall of the shallow trench isolation structure.

7. The structure of claim 3, wherein the at least non-single-crystal semiconductor region contacts a bottom of the shallow trench isolation structure.

8. The structure of claim 1, wherein the at least one non-single-crystal semiconductor region is close to a base collector junction and at a corner of a shallow trench isolation structure within the collector region.

9. The structure of claim 1, wherein the at least one non-single-crystal semiconductor region comprises a trap rich semiconductor material.

10. The structure of claim 1, wherein the at least non-single-crystal semiconductor region comprises amorphous Si.

11. The structure of claim 1, wherein the at least one non-single-crystal semiconductor region comprises a polysilicon material.

12. The structure of claim 1, further comprising at least one other transistor on a same substrate as the heterojunction bipolar transistor and being devoid of the non-single-crystal semiconductor region which comprises at least one amorphous semiconductor region.

13. A structure comprising:
    a heterojunction bipolar transistor comprising a collector region, a base region and an emitter region;
    a shallow trench isolation structure below the base region in a semiconductor substrate of the collector region;
    at least one amorphous semiconductor region close to a junction of the base region and the collector region and a corner of the shallow trench isolation structure; and
    at least one other transistor on a same substrate as the heterojunction bipolar transistor and being devoid of the at least one amorphous semiconductor region.

14. The structure of claim 13, wherein the heterojunction bipolar transistor comprises a sub-collector region vertically below the collector region, and the at least one amorphous semiconductor region being above the sub-collector region within the collector region.

15. The structure of claim 13, wherein the at least one amorphous semiconductor region contacts a sidewall and bottom of the shallow trench isolation structure.

16. The structure of claim 13, wherein the at least one amorphous semiconductor region contacts a sidewall or a bottom of the shallow trench isolation structure.

17. The structure of claim 13, wherein the at least one amorphous semiconductor region is close to a base collector junction and at a corner of the shallow trench isolation structure within the collector region.

18. The structure of claim 13, wherein the at least one amorphous semiconductor region comprises a polysilicon material.

19. A method comprising:
forming a heterojunction bipolar transistor comprising a collector region, a base region and an emitter region;
forming at least one amorphous semiconductor region in the collector region of the heterojunction bipolar transistor; and
forming at least one other transistor on a same substrate as the heterojunction bipolar transistor and being devoid of the at least one amorphous semiconductor region.

* * * * *